United States Patent
Huang et al.

(10) Patent No.: US 8,335,369 B2
(45) Date of Patent: Dec. 18, 2012

(54) MASK DEFECT ANALYSIS

(75) Inventors: Liang-Jung Huang, Tainan (TW); Chen-Long Duan, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 979 days.

(21) Appl. No.: 11/747,150

(22) Filed: May 10, 2007

(65) Prior Publication Data

US 2008/0205743 A1 Aug. 28, 2008

Related U.S. Application Data

(60) Provisional application No. 60/892,084, filed on Feb. 28, 2007.

(51) Int. Cl.
*G06K 9/00* (2006.01)
*G03F 1/00* (2012.01)

(52) U.S. Cl. ............... 382/144; 382/145; 430/5

(58) Field of Classification Search .......... 382/141–145, 382/173; 430/5, 8, 30
See application file for complete search history.

(56) References Cited

U.S. PATENT DOCUMENTS

| | | | | |
|---|---|---|---|---|
| 5,558,927 | A * | 9/1996 | Aruga et al. | 428/195.1 |
| 5,747,221 | A * | 5/1998 | Kim et al. | 430/311 |
| 5,767,974 | A * | 6/1998 | Higashiguchi et al. | 356/394 |
| 6,268,093 | B1 * | 7/2001 | Kenan et al. | 430/30 |
| 6,297,879 | B1 * | 10/2001 | Yang et al. | 356/237.5 |
| 6,335,981 | B1 * | 1/2002 | Harazaki | 382/144 |
| 6,542,220 | B1 * | 4/2003 | Schrijver et al. | 355/53 |
| 6,674,522 | B2 * | 1/2004 | Krantz et al. | 356/237.1 |
| 6,727,987 | B2 * | 4/2004 | Yonezawa | 356/237.2 |
| 6,735,745 | B2 * | 5/2004 | Sarig | 716/4 |
| 7,037,627 | B2 * | 5/2006 | Aoki et al. | 430/5 |
| 7,117,140 | B2 * | 10/2006 | Toyama | 703/14 |
| 7,260,813 | B2 * | 8/2007 | Du et al. | 716/51 |
| 7,313,780 | B2 * | 12/2007 | Khoh et al. | 716/53 |
| 7,596,776 | B2 * | 9/2009 | Tanaka et al. | 716/56 |
| 2001/0038954 | A1 * | 11/2001 | Smith | 430/5 |
| 2002/0019729 | A1 * | 2/2002 | Chang et al. | 703/6 |
| 2002/0042007 | A1 * | 4/2002 | Miyazaki et al. | 430/5 |
| 2002/0044277 | A1 * | 4/2002 | Yonezawa | 356/237.2 |

(Continued)

FOREIGN PATENT DOCUMENTS

CN 1424743 6/2003

(Continued)

OTHER PUBLICATIONS

Ferguson et al. "Application of an Aerial Image Measurement System to Mask Fabrication and Analysis" SPIE vol. 2087 Photomask Technology and Management (1993) pp. 1-14.*

(Continued)

*Primary Examiner* — David Zarka
*Assistant Examiner* — Mia M Thomas
(74) *Attorney, Agent, or Firm* — Haynes and Boone, LLP

(57) ABSTRACT

A method of inspecting a photomask includes directing radiation from a radiation source onto a photomask so that at least a portion of the radiation is transmitted through the photomask. A first photomask image is detected from the transmitted portion of the radiation transmitted through the photomask and perceptible at a second side of the photomask. A second photomask image is created by applying an exposure simulation model to a photomask design. A difference between the first photomask image and the second photomask image is then determined.

20 Claims, 8 Drawing Sheets

U.S. PATENT DOCUMENTS

| | | | |
|---|---|---|---|
| 2002/0098421 A1* | 7/2002 | Hasegawa et al. | 430/5 |
| 2002/0167729 A1* | 11/2002 | Saeki | 359/569 |
| 2002/0171825 A1* | 11/2002 | Krantz et al. | 356/237.1 |
| 2002/0194576 A1* | 12/2002 | Toyama | 716/21 |
| 2003/0073010 A1* | 4/2003 | Narukawa et al. | 430/5 |
| 2004/0086791 A1* | 5/2004 | Aoki et al. | 430/5 |
| 2004/0165763 A1* | 8/2004 | Dettmann et al. | 382/144 |
| 2004/0181769 A1* | 9/2004 | Kochpatcharin et al. | 716/19 |
| 2004/0218784 A1* | 11/2004 | Nichani et al. | 382/103 |
| 2004/0257568 A1* | 12/2004 | Yamane | 356/394 |
| 2005/0040541 A1* | 2/2005 | Kurita et al. | 257/778 |
| 2005/0048379 A1* | 3/2005 | Koehle et al. | 430/5 |
| 2005/0050512 A1* | 3/2005 | Kochan et al. | 716/21 |
| 2005/0166172 A1* | 7/2005 | Kawamura et al. | 716/19 |
| 2006/0051687 A1* | 3/2006 | Ito et al. | 430/30 |
| 2006/0088200 A1* | 4/2006 | Du et al. | 382/144 |
| 2006/0206852 A1* | 9/2006 | Khoh et al. | 716/19 |
| 2006/0269118 A1* | 11/2006 | Lee et al. | 382/144 |
| 2007/0009808 A1* | 1/2007 | Abrams et al. | 430/5 |
| 2007/0055467 A1* | 3/2007 | Tsuji et al. | 702/81 |
| 2007/0150850 A1* | 6/2007 | Itoh | 716/21 |
| 2007/0234269 A1* | 10/2007 | Tanaka et al. | 716/21 |
| 2008/0024601 A1* | 1/2008 | Sato et al. | 348/80 |

FOREIGN PATENT DOCUMENTS

JP  2000-146850  5/2000

OTHER PUBLICATIONS

Cobb et al. "Fast Optical and Process Proximity Correction Algorithms for IC Manufacturing" UC Berkley Department of Electrical Engineering Spring 1998, pp. 1-139.*

Erdelyi et al. "Enhanced optical microlithography with a Fabry-Perot based spatial filtering technique" Applied Optics, vol. 39, No. 7 Mar. 1, 2000, pp. 1-9.*

GDSII Stream Format Wikipedia definition pp. 1-3.*

Livesay et al. "An electron image projecttion stepper" Electron Vison Corp. Sep. 1985 pp. 1-5.*

Chinese Patent Office, Chinese Office Action of Apr. 3, 2009; No. 2008100805289, 6 pages.

Chinese Patent Office, Office action dated Jul. 19, 2010, Application No. 200810080528.9, 5 pages.

* cited by examiner

MASK DEFECT ANALYSIS

RELATED APPLICATION

This application claims the benefit of priority under 35 U.S.C. §119(e) of U.S. Provisional Application No. 60/892,084, filed Feb. 28, 2007.

BACKGROUND

Semiconductor photolithography processes utilize photomasks for patterning. Integrated circuit (IC) technology is continually progressing to circuit layouts having smaller feature sizes as well as increased density. As a result of this continuous progression, even very small defects in the photomask can negatively affect production yields.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 8 illustrates a photomask image created by one embodiment of the method shown in FIG. 7.

DETAILED DESCRIPTION

The present disclosure relates generally to lithography systems and a method of analyzing a photomask used in a lithography system for defects. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
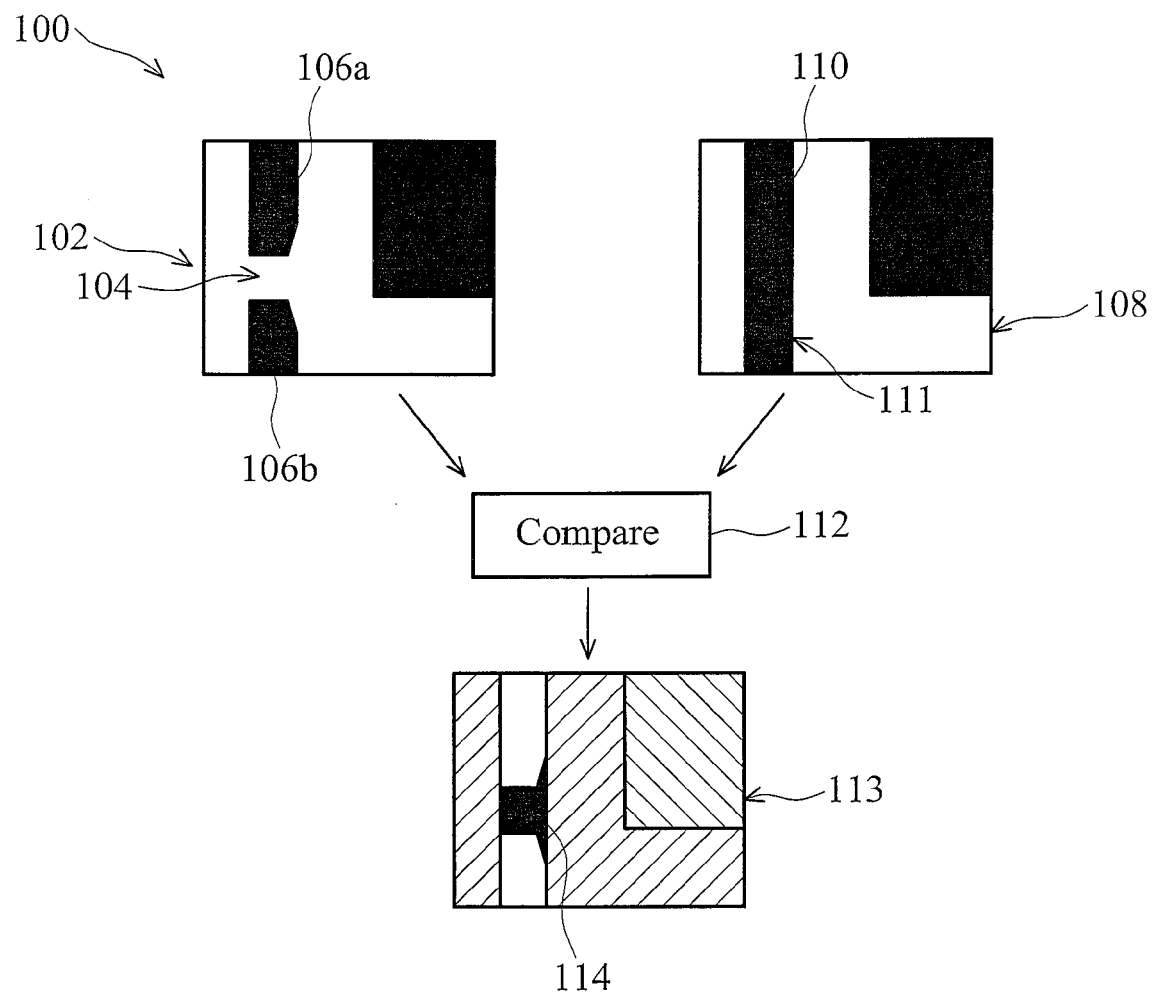
FIG. 1 illustrates a system for analyzing semiconductor mask defects in accordance with one embodiment of the present invention.

Referring to FIG. 1, illustrated is one embodiment of an exemplary system 100 for analyzing semiconductor mask defects. The system 100 is configured and designed to compare two photomask images and to produce a resultant photomask comparison image, as discussed in greater detail below.

The comparison system 100 includes a first photomask image 102, which may be produced by an exposure-based simulation system as more fully described below. In one embodiment, the first photomask image 102 is a grayscale bitmap image where each pixel has a value in the range of 0 to 255. The first photomask image 102 is illustrated in FIG. 1 as showing a gap 104. The gap 104 is a portion of line segment 106a-106b which is missing in first photomask image 102. The gap 104 in first photomask image 102 may be caused by a defect in the photomask used to create first photomask image 102. It is understood that the gap 104 is drawn relatively large for the sake of clarity in the present discussion, and in some embodiments, may be a very small defect.

The comparison system 100 also includes a second photomask image 108, which may be produced by a model-based simulation system as more fully described below. In one embodiment, the second photomask image 102 is a grayscale bitmap image where each pixel has a value in the range of 0 to 255. The second photomask image 108 is illustrated in FIG. 1 as having a line segment 110. Line segment 110 is contiguous and has no gap at a location 111. Location 111 on second photomask image 108 corresponds to the location of gap 104 on first photomask image 102.

Continuing to refer to FIG. 1, the system 100 includes a comparator 112 for comparing the first photomask image 102 to the second photomask image 108. In the present embodiment, the comparator 112 is a computer including a processing unit, memory, and input/output for receiving the first and second photomasks images 102, 108 and providing a comparison result, as discussed in greater detail below. It is further understood that the comparator can be created by multiple, separate systems, or may be a part of any of the systems further discussed below, such as with respect to FIGS. 2 and 3.

The comparator 112 creates a resultant image 113. In one embodiment, resultant image 113 is a grayscale bitmap image where each pixel has a value in the range of 0 to 255. In another embodiment, the resultant image 113 is comprised of pixels having values in the range of −255 to 255. The value of a pixel in resultant image 113 may, for example, be the difference between the value of a pixel in first photomask image 102 and a corresponding pixel in second photomask image 108. In one embodiment, the value of a pixel in resultant image 113 is the absolute value of the difference between a value of a pixel in the first photomask image 102 and a value of a corresponding pixel in second photomask image 108. As illustrated in FIG. 1, the resultant image 113 includes a mark at a location 114 where the pixel values differ substantially from the values of other pixels in image 113. In other embodiments, the difference between the first photomask image 102 and the second photomask image 108 at the location 114 may be shown in resultant image 113 as black, white, colored, crosshatched, or in any other perceptible manner operable to indicate a difference at location 114.

The mark at location 114 corresponds with gap 104 in first photomask image 102 that is not present at location 111 in second photomask image 108. The mark at location 114 indicates that first photomask image 102 at gap 104 is substantially different from second photomask image 108 at location 111. The mark at location 114 may indicate that a defect exists in the photomask used to create first photomask image 102.

Figure 2:
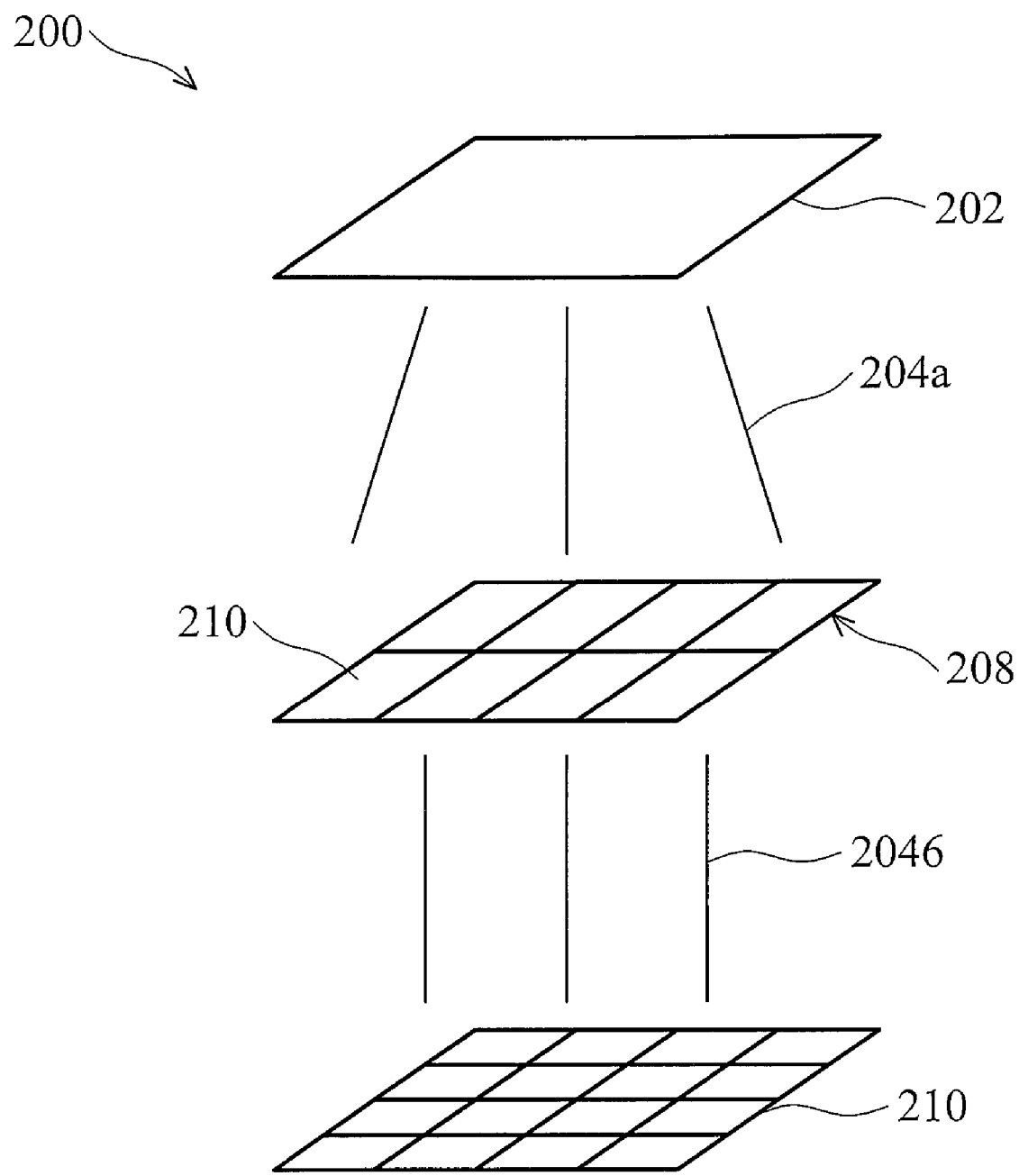
FIG. 2 illustrates a system for producing an exposure-based photomask image.

Referring now to FIG. 2, illustrated is an exposure-based lithography simulation system 200 for producing the first photomask image 102. In one embodiment, the system 200 is a commercially available microlithography simulation microscope, such as the Aerial Image Measurement System (AIMS) from Carl Zeiss Microelectronics Systems. System 200 includes a radiation source 202 to provide radiation beams 204a. The radiation source 202 may be a suitable electromagnetic energy source such as an ultra-violet (UV), deep ultra-violet (DUV), or X-ray source. More specifically, the radiation source 202 may be, a mercury lamp having a wavelength of 365 nm (I-line); a Krypton Fluoride (KrF)

excimer laser with wavelength of 248 nm; or an Argon Fluoride (ArF) excimer laser with a wavelength of 193 nm. Additionally, immersion technology may be employed to lower the effective wavelength of the radiation beams 204a.

Radiation beams 204a are directed onto a photomask 208 containing a mask pattern 210. The mask pattern 210 is designed according to integrated circuit features to be formed on a semiconductor substrate. In one embodiment, the mask pattern 210 may includes an absorption layer formed using a plurality of processes and materials, such as depositing a metal film made with chromium (Cr), iron oxide, or an inorganic film made with MoSi, ZrSiO, SiN, and/or TiN. The absorption layer is patterned to have one or more openings where radiation beams may travel through without being absorbed and have one or more absorption areas where the radiation beams may be completely or partially blocked thereby. In another embodiment, the mask pattern 210 may include phase shift features formed above, on and/or at least partially in the substrate of photomask 208 by etching thereof. The pattern layer 210 may be a binary intensity mask (BIM or binary mask) including chrome areas and transparent quartz areas. In another embodiment, the mask pattern 210 may be an alternating phase shift mask (AltPSM), employing alternating areas of chrome and 180 degree-shifted quartz. In another embodiment, the mask pattern 210 may be an attenuating phase shift mask (AttPSM), employing an attenuating feature having a phase shift relative to the transparent substrate. Alternatively, the mask pattern 210 may be a chromeless phase shift pattern. In another embodiment, the mask pattern 210 may include a combination of binary features and various phase shift features. Additionally, the mask pattern 210 may include various optical proximity correction (OPC) features designed for fixing an optical proximity affect.

A portion of the radiation 204a directed onto photomask 208 that travels through, or is transmitted through, the photomask 208 is identified as patterned radiation 204b. Patterned radiation 204b may differ from radiation 204a in phase, direction, amplitude, and/or wavelength. Patterned radiation 204b is directed onto a radiation detector 210. The radiation detector 210 may be photoreactive film, a particle detector, a charge-coupled device (CCD) image sensor, a complementary metal oxide semiconductor (CMOS) image sensor, or any other device operable to detect the pattern formed by the transmitted radiation 204b. The radiation detector 210 may be coupled to a computer (not shown) for storing an image of the transmitted radiation pattern. In the present embodiment, an image detected by the radiation detector 210 is used to produce the first photomask image 102.

Figure 3:
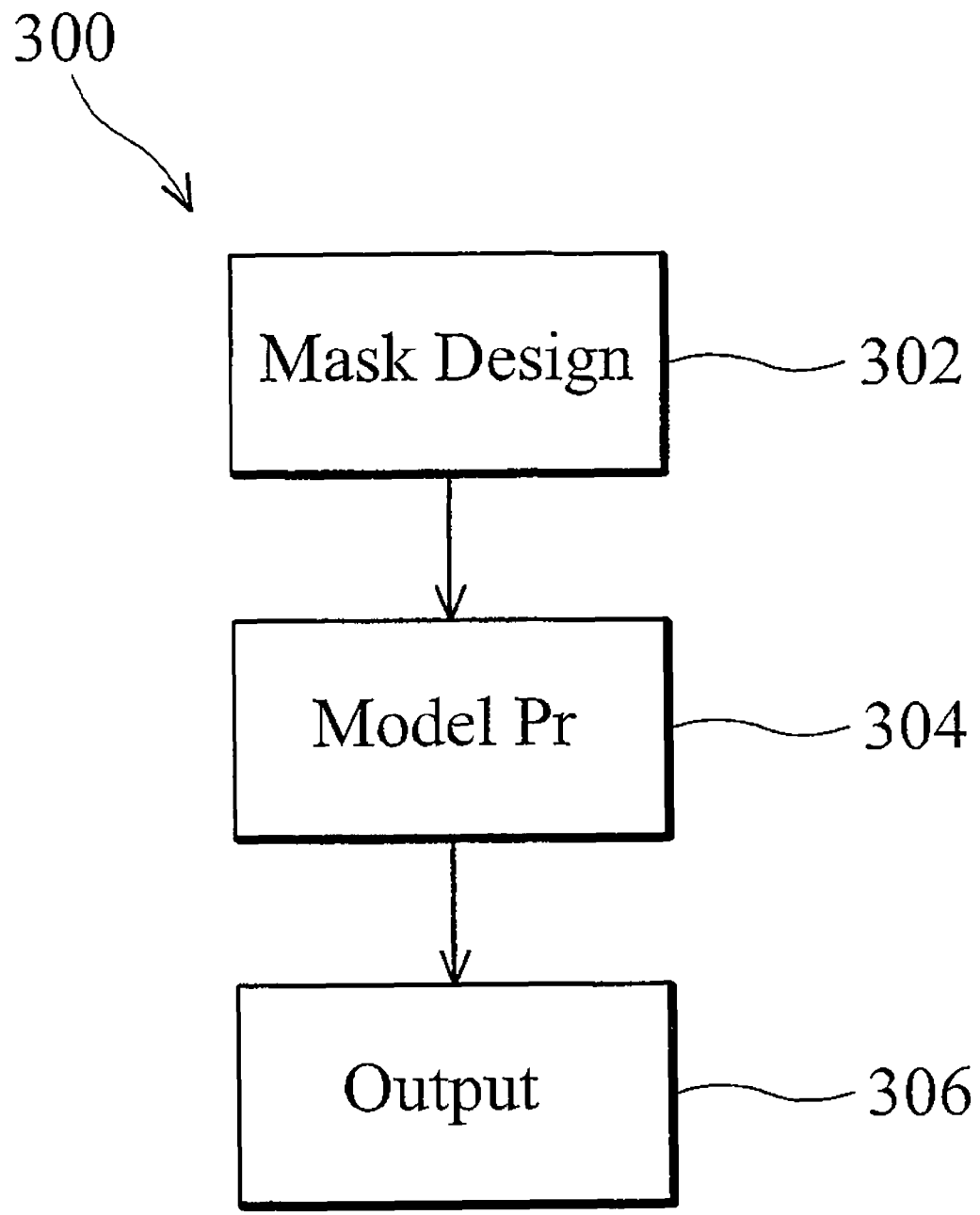
FIG. 3 illustrates a system for producing a model-based photomask image.

FIG. 3 illustrates a system 300 for producing the second photomask image 104. The system 300 includes a mask design 302, which may be a vector or raster image of a photomask design. For example, the mask design 302 may be a CAD drawing or a file in GDSII format. The mask design 302 is processed by a model 304. The model 304 may be an exposure simulation model, such as a model that calculates the effects of magnification, edge bias, and corner rounding that occur when exposing a photomask under a radiation source. The model 304 may calculate the effect of light diffraction on a photomask exposure. In some embodiments, the model 304 calculates effects using the laws of physics, an empirical model, statistics, or a combination thereof. In certain embodiments, the model 304 may be implemented as a computer program. The output of the model 304 is a model-based photomask image 306. In the present embodiment, the photomask image 306 is used to produce the second photomask image 104.

Figure 4:
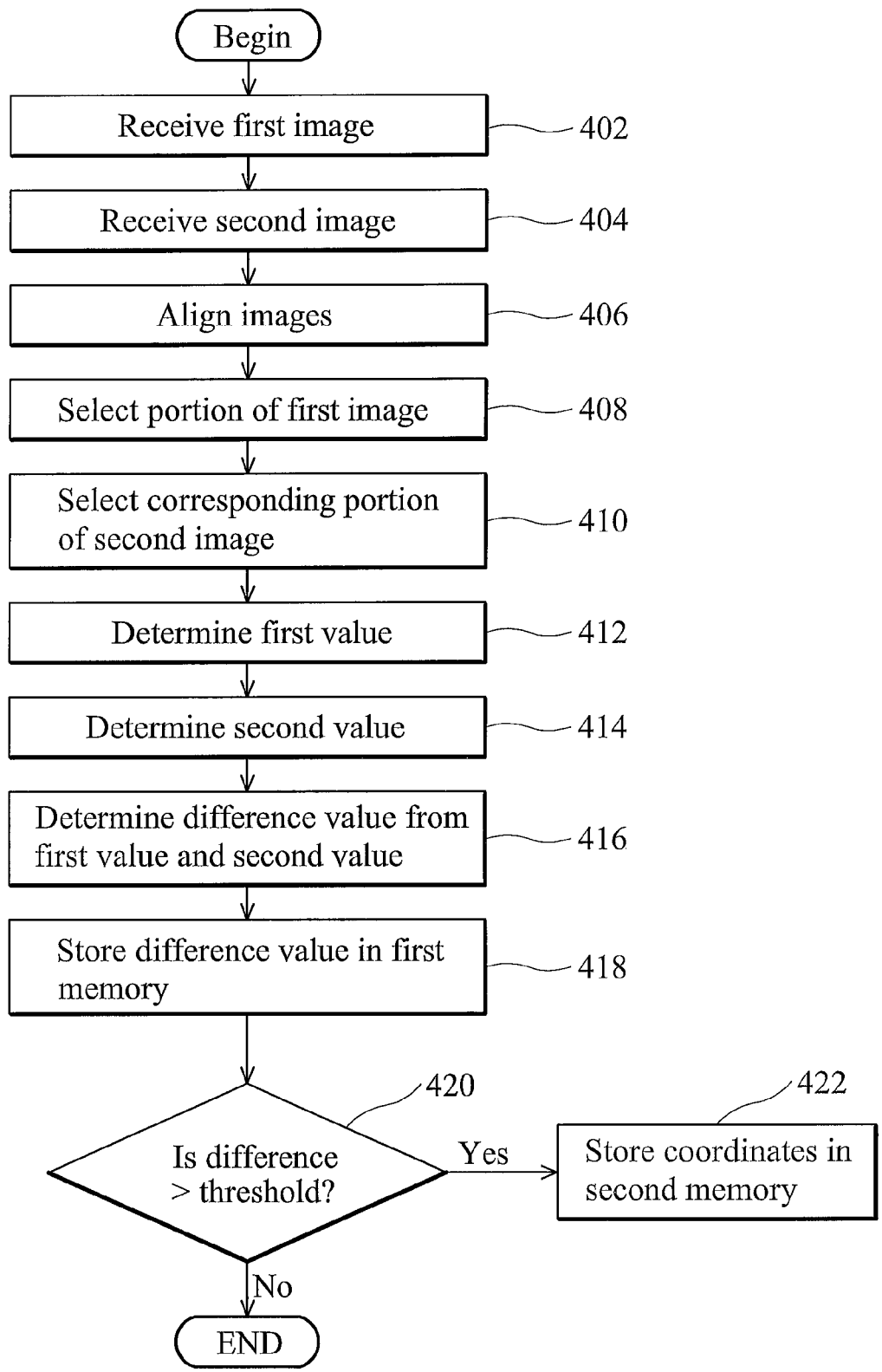
FIG. 4 is a flowchart of one embodiment of a method for comparing two photomask images.

FIG. 4 illustrates a method 400 for comparing two photomask images. The method 400 begins with receiving a first photomask image in step 402. The first photomask image may be an image from an exposure-based photomask analyzer. For example, the comparison system 200 (FIG. 2) produces the first photomask image 104 (FIG. 1). The first photomask image may be a raster image, such as a color or grayscale bitmap image. In one embodiment, the first photomask image is an 8-bit grayscale bitmap image where each pixel is represented by one byte, so that each pixel has a value in the range of 0 to 255. The value of a pixel may correspond to the amount of radiation exposure received at a portion of the first photomask corresponding to the pixel.

The method 400 continues to step 404 with receiving a second photomask image. The second photomask image may be an image from a model-based photomask analyzer. For example, the system 300 (FIG. 3) produces the second photomask image 108 (FIG. 1). The second photomask image may be a raster image, such as a color or grayscale bitmap image. In one embodiment, the second photomask image is an 8-bit grayscale bitmap image where each pixel is represented by one byte, so that each pixel has a value in the range of 0 to 255. The value of a pixel may correspond to the amount of radiation exposure received at a portion of the second photomask corresponding to the pixel.

Continuing to refer to FIG. 4, step 406 includes aligning the first and second photomask images so that corresponding portions of the first and second photomask images are located at corresponding coordinates. The alignment may be accomplished visually by an operator, or automatically by a computer. The alignment may involve rotating, resizing, distorting, warping, translating or otherwise graphically transforming one, both, or neither of the photomask images. A portion of the first photomask image may correspond to a portion of the second photomask image when the portion of the first photomask image is produced by the same relative part of a photomask or photomask design as produced the portion of the second photomask image. Corresponding coordinates are a coordinate of a portion of the first photomask image and a coordinate of a corresponding portion of the second photomask image. In one embodiment, the aligning is accomplished by determining an offset between a corresponding coordinates. In another embodiment, the aligning is accomplished by rotating, resizing, distorting, warping, translating or otherwise graphically transforming one, both, or neither of the photomask images so that identical coordinates identify corresponding portions of the first and second photomask images.

In step 408, a portion of the first photomask image is selected. In certain embodiments, the portion of the first photomask is one or more pixels. For example, the portion of the first photomask may be one pixel, a 3-by-3 square matrix of pixels, or a 5-by-5 square matrix of pixels. The selected portion may also be an irregular shape, such as the shape of a plus sign. In one embodiment, the selected portion is a 3-by-3 plus-shaped matrix of pixels comprising a center pixel and four immediately contiguous pixels, that is, a center pixel and one pixel each above, below, to the left, and to the right of the center pixel.

In step 410, a corresponding portion of the second photomask image is selected. The selected portion of the second photomask image may be the same or different size or shape as the selected portion of the first photomask image. In one embodiment, the selected portion of the second photomask is the same size and the same shape as the selected portion of the first photomask image.

The method 400 continues with step 412 where a first value is determined from the selected portion of the first photomask image. In one embodiment, the first value is an arithmetic average of the values of the pixels comprising the selected portion of the first photomask image. In another embodiment, wherein the selected portion of the first photomask image includes one pixel, the first value is the value of that pixel. In other embodiments, the first value may be a geometric average, a weighed average, or a result of any other mathematical operation on the selected portion of the first photomask image.

In step 414, a second value is determined from the selected portion of the second photomask image. In one embodiment, the second value is an arithmetic average of the values of the pixels comprising the selected portion of the second photomask image. In another embodiment, wherein the selected portion of the second photomask image includes one pixel, the second value is the value of that pixel. In other embodiments, the second value may be a geometric average, a weighed average, or the result of any other mathematical operation on the selected portion of the second photomask image.

The method 400 continues with step 416 which includes determining a difference between the first value determined in step 412 and the second value determined in step 414. The difference may be the result of one or more arithmetic operations on the first and second values determined in steps 412 and 414. In one embodiment, the difference is the arithmetic result of subtracting the second value from the first value. In another embodiment, the difference is the arithmetic result of subtracting the first value from the second value. In still another embodiment, the difference is the absolute value of the arithmetic result of subtracting the first value from the second value. In yet another embodiment, the difference is the arithmetic result of subtracting the square of the first value from the square of the second value. In still another embodiment, the difference is the square root of the absolute value of the difference between the squares of the first and second values.

At step 418, the difference determined in step 416 is stored in a first memory. The difference may be stored, for example, in a computer memory. In another embodiment, the difference is stored as the value of a pixel in a raster image, such as an 8-bit grayscale bitmap image. In embodiments where the memory used to store the difference is a raster image, the raster image may have dimensions that are the same as or different than the first or second photomask images.

The method 400 then continues in step 420 with performing a logical operation to compare the difference determined in step 416 to a predetermined threshold. The predetermined threshold may represent a desired difference limit beyond which the difference in exposure between the first photomask image and the second photomask image is indicative of a photomask defect. In one embodiment, the predetermined threshold is 50. The logical operation comparing the difference to the predetermined threshold may, for example, include determining whether the difference is greater than the predetermined threshold. In another embodiment, the comparison operation includes determining whether the difference is greater than or equal to the predetermined threshold.

If at step 420 the logical operation is determined to be true, then the method 400 continues with step 422. If the logical operation of step 420 is determined to be false, then the method 400 ends.

Step 422 is performed when the logical operation of step 420 is determined to be true. For example, step 422 may be performed when the difference from Step 416 is greater than the predetermined threshold of step 420. In step 422, a coordinate location is stored in a second memory. The coordinate location may be the coordinates of the selected portion of the first photomask image, the coordinates of the selected portion of the second photomask image, or the coordinates of the difference value stored in Step 418. The second memory may, for example, be a computer memory. The second memory may, for example, be a list of one or more photomask image coordinates where a large difference was determined in step 416 and which may be indicative of photomask defects. In one embodiment, the second memory includes an array. In another embodiment, the second memory includes a linked list. After step 422, the method 400 ends.

Figure 5:
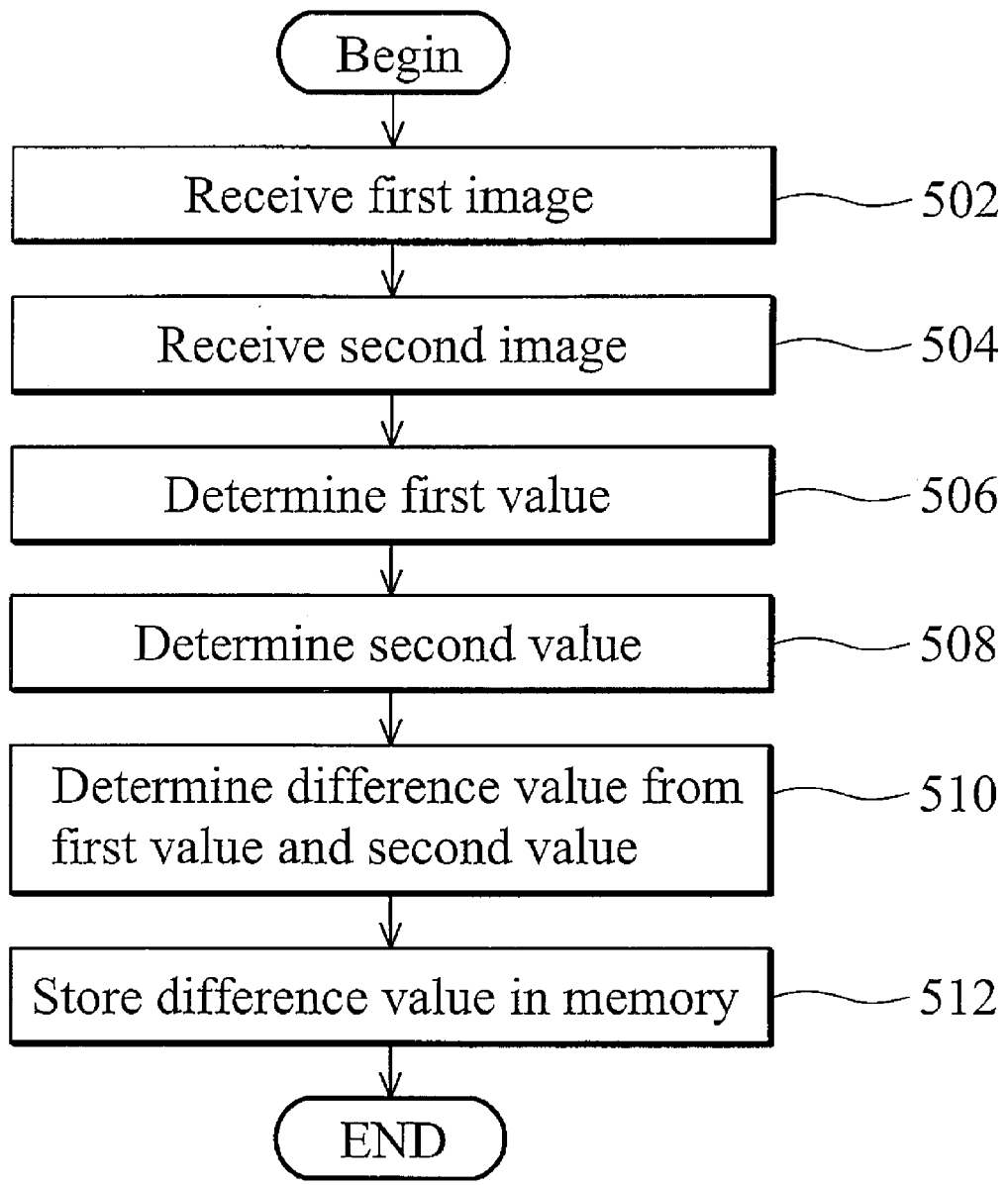
FIG. 5 is a flowchart of another embodiment of a method for comparing two photomask images.

FIG. 5 illustrates another method 500 for comparing a first photomask image and a second photomask image. The method 500 begins with step 502 receiving a first photomask image. The first photomask image may be an image from an exposure-based photomask analyzer. For example, a system such as is shown in FIG. 2 may have produced the first photomask image. The first photomask image may be a raster image, such as a color or grayscale bitmap image. In one embodiment, the first photomask image is an 8-bit grayscale bitmap image where each pixel is represented by one byte, so that each pixel has a value in the range of 0 to 255. The value of a pixel may correspond to the amount of radiation exposure received at a portion of the first photomask corresponding to the pixel.

The method 500 continues in step 504 with receiving a second photomask image. The second photomask image may be an image from a model-based photomask analyzer. For example, a system such as is shown in FIG. 3 may have produced the second photomask image. The second photomask image may be a raster image, such as a color or grayscale bitmap image. In one embodiment, the second photomask image is an 8-bit grayscale bitmap image where each pixel is represented by one byte, so that each pixel has a value in the range of 0 to 255. The value of a pixel may correspond to the amount of radiation exposure received at a portion of the second photomask corresponding to the pixel.

The method 500 then continues with step 506 determining a first value from the first photomask image. In one embodiment, the first value is the value of a pixel in the first photomask image. In another embodiment, the first value is an arithmetic average of the values of multiple pixels in the first photomask image. In other embodiments, the first value may be a geometric average, a weighed average, or a result of any other mathematical function of the values of one or more pixels of the first photomask image.

Next, step 508 includes determining a second value from the second photomask image. The second value may, for example, be a value of a pixel in the second photomask image. In another embodiment, the second value is an arithmetic average of the values of multiple pixels in the first photomask image. In other embodiments, the second value may be a geometric average, a weighed average, or a result of any other mathematical function of the values of one or more pixels of the second photomask image.

The method 500 then continues with step 510 which includes determining a difference between the first value determined in step 506 and the second value determined in step 508. The difference may be the result of one or more arithmetic operations on the first and second values. In one embodiment, the difference is the arithmetic result of subtracting the second value from the first value. In another embodiment, the difference is the arithmetic result of subtracting the first value from the second value. In still another embodiment, the difference is the absolute value of the arithmetic result of subtracting the first value from the second value. In yet another embodiment, the difference is the arithmetic result of subtracting the square of the first value from the square of the second value. In still another embodiment, the difference is the square root of the difference between the squares of the first and second values.

After determining the difference in step 510, the method 500 continues with step 512 storing the difference in a memory. The difference may be stored, for example, in a computer memory. In another embodiment, the difference is stored as the value of a pixel in a raster image, such as an 8-bit grayscale bitmap image. In embodiments where the memory used to store the difference is a raster image, the raster image may have dimensions that are the same as or different than the first or second photomask images. After step 510, the method 500 ends.

Figure 6:
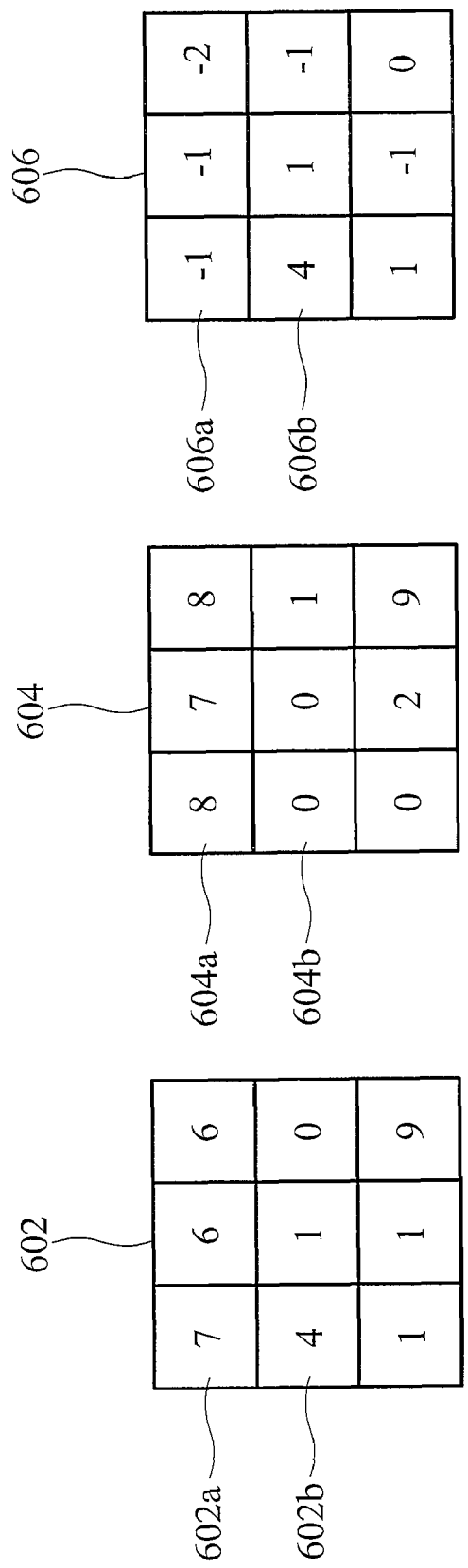
FIG. 6 illustrates three exemplary photomask images.

FIG. 6 illustrates three exemplary photomask images. The exemplary photomask images of FIG. 6 are presented to illustrate one embodiment of the method 500 shown in FIG. 5. The examples shown in FIG. 6 are not intended to define or limit the scope of the claims. FIG. 6 shows a first photomask image 602, which may be an image from an exposure-base photomask analyzer, such as the system of FIG. 2. First photomask image 602 is an example of an image that may be received in step 502 of the method 500. First photomask image 602 includes a 3-by-3 matrix of pixels with each pixel having a value in the range of 0 to 9. First photomask image 602 is an illustrative example of one embodiment of a first photomask image and is not intended to define or limit the scope of the claims. First photomask image 602 includes pixel 602a, which has a value of 7. The value of pixel 602a—that is, 7—is an example of a first value that may be determined in step 506 of the method 500.

Also shown in FIG. 6 is second photomask image 604, which may be an image from a model-based photomask analyzer, for example, the system of FIG. 3. Second photomask 604 is an example of an image that may be received in step 504 of the method 500. Second photomask image 604 includes a 3-by-3 matrix of pixels with each pixel having a value in the range of 0 to 9. Second photomask image 604 is an illustrative example of one embodiment of a second photomask image and is not intended to define or limit the scope of the claims. Second photomask 604 includes a pixel 604a, which has a value of 8. The value of pixel 604a—that is, 8—is an example of a first value that may be determined in step 508 of the method 500.

FIG. 6 also illustrates resultant image 606, which may be produced by certain embodiments of step 512 of the method 500. Resultant image 606 includes a 3-by-3 matrix of pixels where each pixel has a value in the range of −9 to 9. Resultant image 606 is an illustrative example of one embodiment of memory that may be used to store a difference value in step 512 of the method 500 and is not intended to define or limit the scope of the claims. Resultant image 606 includes a pixel 606a, which has a value of −1. The value of pixel 606a—that is, −1—is an example of a difference value that may be determined in one embodiment of step 510 of the method 500. More specifically, the value of pixel 606a (−1) is the result of subtracting the value of pixel 604a (8) from the value of pixel 602a (7).

The following discussion describes an example of how one embodiment of the method 500 of FIG. 5 may be applied to the exemplary photomask images 602 and 604 of FIG. 6. First, in step 502, the first photomask image 602 is received. Then in step 504, the second photomask image 604 is received. In step 506, a first value is determined. In this illustrative example, the first value is determined to be the value of pixel 602b, 4. Next, a second value is determined in step 508. In this example, the second value is determined to be the value of pixel 604b, 0. In step 510, a difference is determined from the first and second values. In this example, the difference is determined by subtracting the second value (0) from the first value (4). The difference result is 4. Finally, in step 512, the difference result is stored in memory 606b.

Figure 7:
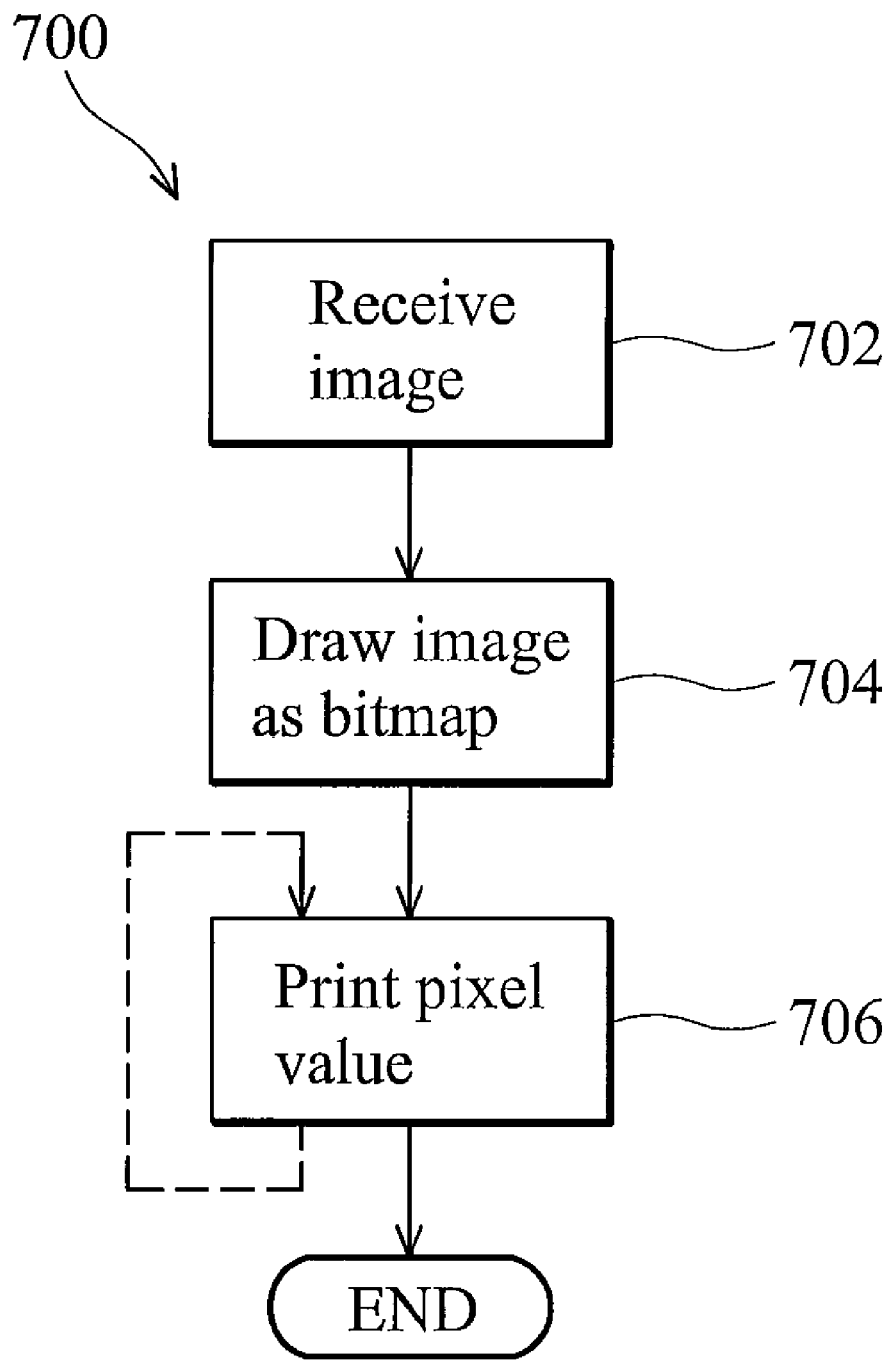
FIG. 7 is a flowchart of one embodiment of a method of displaying an image.

FIG. 7 illustrates a method 700 for displaying an image. The method 700 may be used, for example, to graphically display a difference result such as resultant image 606. The method 700 may also be used to display a photomask image such as first photomask image 102 or second photomask image 108. The method 700 begins with step 702 receiving an image. As previously mentioned, the received image may be a photomask image or an image produced by a comparison the method such as the methods 400 and 500. More generally, the received image may be a raster image, such as a color or grayscale bitmap.

In step 704, the received image is output. All or a portion of the received image may be output. The received image may be output to a monitor, a display, a printer, a plotter, a projector, a memory or any other output device. After the image is output in step 704, a pixel value is output at step 706. The pixel value is output so as to be superimposed on the image output. The pixel value may be output using any font, including a fixed-width font or a variable-width font. In one embodiment, the fixed width font Courier is used to output the pixel value. The pixel value may be output in binary, octal, decimal, hexadecimal, or any other numerical base. In one embodiment, the pixel value is output in hexadecimal, also known as base 16.

In one embodiment of the method 700 for outputting a grayscale image, the pixel value may be the value of a pixel in the image. In another embodiment of the method 700 for outputting a color image, the pixel value may be the value of a pixel in one color channel of the image or the value of the average of the values of a pixel in multiple color channels. In one embodiment, the pixel value is output on the image substantially at the location of the corresponding pixel in the image output. In certain embodiments, step 706 may be repeated so that multiple pixel values are output. In one embodiment, step 706 is repeated so that multiple pixel values are output at regularly repeating horizontal and vertical intervals, for example, at every twentieth pixel. After step 706 completes, the method ends.

Figure 8:
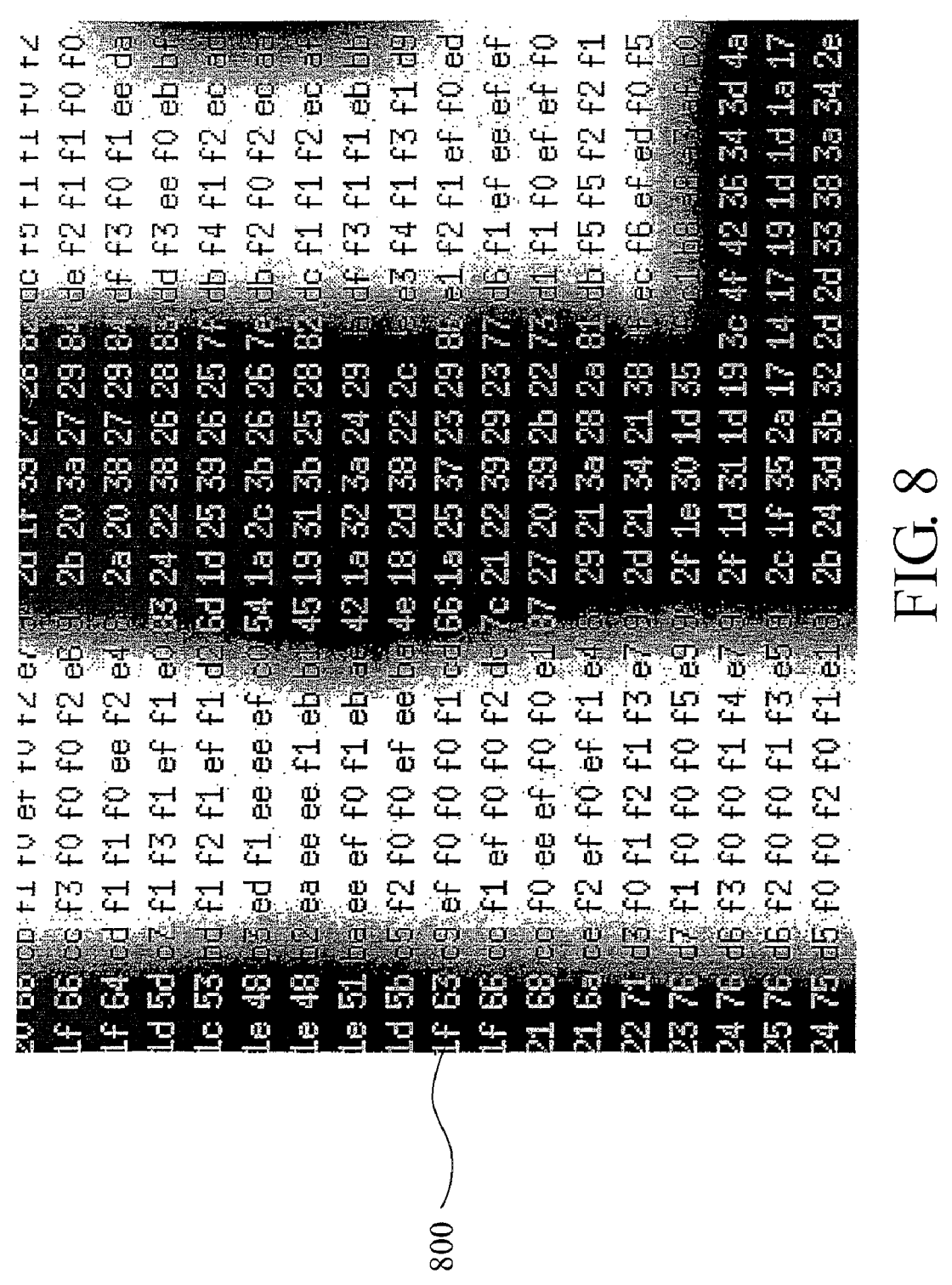

FIG. 8 illustrates an example of an image output by one embodiment of the method 700 of FIG. 7. An image 800 shows a grayscale image of a portion of a photomask image. Superimposed on the grayscale image are hexadecimal pixel values output at regularly repeating intervals.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of inspecting a photomask comprising:
   directing radiation from a radiation source onto a first side of a photomask so that at least a portion of the radiation is transmitted through the photomask;

detecting a first photomask image from the transmitted portion of the radiation transmitted through the photomask and perceptible at a second side of the photomask;

creating a second photomask image by applying an exposure simulation model to a photomask design;

determining, with a comparator, a difference between the first photomask image and the second photomask image, the comparator comprising a computer, wherein determining a difference comprises:

determining a first value from a portion of the first photomask image;

determining a second value from a portion of the second photomask image; and determining a difference from the first value and the second value;

comparing the difference to a predetermined threshold; and storing a coordinate location of one of the portion of the first photomask image and the portion of the second photomask image if the difference between the portions exceeds the predetermined threshold.

2. The method of claim 1 wherein the photomask design is a GDSII file.

3. The method of claim 1 wherein the detecting step is performed by an aerial image measurement system.

4. The method of claim 1 wherein the difference determined from the first value and the second value is an arithmetic difference between the first value and the second value.

5. The method of claim 1 wherein the portion of the first photomask image comprises a pixel of the first photomask image.

6. The method of claim 1 wherein the portion of the first photomask image comprises a matrix of pixels of the first photomask image.

7. The method of claim 6 wherein the matrix of pixels comprises a square matrix of pixels of the first photomask image.

8. The method of claim 1 wherein the photomask includes non-binary features.

9. The method of claim 1 wherein the radiation has a wavelength of less than or equal to 193 nm.

10. The method of claim 1 wherein the exposure simulation model is operable to simulate the effects of magnification, edge bias, and corner rounding.

11. The method of claim 1, including storing a coordinate location of the portion of the first photomask image if the difference exceeds the predetermined threshold.

12. The method of claim 1, including creating a resultant image based upon the difference between the first photomask image and the second photomask image.

13. The method of claim 12, wherein creating the resultant image includes forming the resultant image from a plurality of pixels where each pixel in the plurality of pixels has a value indicative of the difference between a pixel in the first photomask image and a corresponding pixel in the second photomask image.

14. A system for inspecting photomasks comprising:

a microlithography simulation microscope for producing a first image of a photomask under conditions similar to wafer production, the first photomask image composed of a first plurality of pixels each having a value indicative of an amount of radiation exposure;

first computing logic comprising an exposure simulation model operable to:

receive a photomask design as input;

simulate the effects of light diffraction on the photomask design; and produce a second photomask image as output, the second photomask image composed of a second plurality of pixels each having a value indicative of a simulated amount of radiation exposure;

second computing logic comprising a comparator operable to determine a first average value of pixels in a first matrix of contiguous pixels in the first photomask image, determine a second average value of pixels in a corresponding second matrix of contiguous pixels in the second photomask image, and compare the first average value to the second average value to determine a difference between the first photomask image and the second photomask image.

15. The system of claim 14, wherein the comparator is operable to create a resultant image based upon the difference between the first photomask image and the second photomask image.

16. The system of claim 15, wherein the resultant image is a raster image comprised of a third plurality of pixels where each pixel in the third plurality of pixels has a value indicative of the difference between a pixel in the first photomask image and a corresponding pixel in the second photomask image.

17. The system of claim 16, wherein the raster image is a grayscale bitmap and the value indicative of the difference between a pixel in the first photomask image and a corresponding pixel in the second photomask image is a greyscale value.

18. The system of claim 14, wherein the first and second average values are both one of arithmetic average values, geometric average values, and weighted average values.

19. The system of claim 14, wherein the first matrix of contiguous pixels and the corresponding second matrix of contiguous pixels are both one of square-shaped matrices of pixels and plus-shaped matrices of pixels.

20. A system for inspecting a photomask comprising:

a first data-input operable to receive a first photomask image produced by exposing a photomask to a radiation source and detecting as an image a pattern of radiation transmitted through the photomask;

a second data-input operable to receive a second photomask image produced by applying an exposure simulation model to a photomask design; and a computer operable to receive the first and second photomask images from the first and second data-inputs, respectively, to determine a difference between the first photomask image and the second photomask image, and to compare the difference to a predetermined threshold;

wherein the difference between the first photomask image and the second photomask image is based on a difference between corresponding portions of the first and second photomask images; and wherein the computer is further operable to store a coordinate location of the portion of the first photomask image if the difference between the corresponding portions exceeds the predetermined threshold.

* * * * *